United States Patent
Oshio et al.

(10) Patent No.: US 10,669,479 B2
(45) Date of Patent: Jun. 2, 2020

(54) LIGHT-EMITTING DEVICE

(71) Applicant: Panasonic Intellectual Property Management Co., Ltd., Osaka (JP)

(72) Inventors: Shozo Oshio, Osaka (JP); Takeshi Abe, Osaka (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 0 days.

(21) Appl. No.: 16/486,828

(22) PCT Filed: Oct. 18, 2017

(86) PCT No.: PCT/JP2017/037649
§ 371 (c)(1),
(2) Date: Aug. 17, 2019

(87) PCT Pub. No.: WO2018/150630
PCT Pub. Date: Aug. 23, 2018

(65) Prior Publication Data
US 2020/0024514 A1  Jan. 23, 2020

(30) Foreign Application Priority Data
Feb. 20, 2017  (JP) .................. 2017-029194

(51) Int. Cl.
*C09K 11/77* (2006.01)
*F21V 9/30* (2018.01)

(52) U.S. Cl.
CPC ...... *C09K 11/7774* (2013.01); *C09K 11/7768* (2013.01); *F21V 9/30* (2018.02)

(58) Field of Classification Search
CPC . C09K 11/7774; C09K 11/7768; C09K 11/08; C09K 11/64; F21V 9/30; H01S 5/022; H01L 33/50; F21S 2/00
See application file for complete search history.

(56) References Cited

U.S. PATENT DOCUMENTS

| | | | |
|---|---|---|---|
| 2007/0278930 A1* | 12/2007 | Takahashi | C04B 35/597 313/485 |
| 2009/0072255 A1* | 3/2009 | Takahashi | C09K 11/584 257/98 |

(Continued)

FOREIGN PATENT DOCUMENTS

| JP | 2008-195779 A | 8/2008 |
|---|---|---|
| JP | 2009-074077 A | 4/2009 |

(Continued)

OTHER PUBLICATIONS

International Search Report for corresponding Application No. PCT/JP2017/037649, dated Jan. 16, 2018.

(Continued)

*Primary Examiner* — Kevin Quarterman
(74) *Attorney, Agent, or Firm* — Renner, Otto, Boisselle & Sklar, LLP

(57) ABSTRACT

A light-emitting device 1 includes: a solid-state light-emitting element 10 that radiates a laser beam L; and a wavelength converter 50 including a plurality of types of phosphors which receive the laser beam L and radiate light. The phosphors 50 included in the wavelength converter are substantially composed of a $Ce^{3+}$-activated phosphor. Then, output light of the light-emitting device 1 has a light component across a wavelength range of at least 420 nm or more and less than 700 nm. The light-emitting device 1 is capable of radiating light with high color rendering properties over a wide wavelength range.

20 Claims, 5 Drawing Sheets

(56) References Cited

U.S. PATENT DOCUMENTS

| | | | |
|---|---|---|---|
| 2010/0277054 A1 | 11/2010 | Takashima | |
| 2012/0091494 A1 | 4/2012 | Vishnyakov | |
| 2014/0153216 A1* | 6/2014 | Yamanaka | F21V 5/10 362/84 |
| 2014/0321099 A1 | 10/2014 | Kaide | |
| 2016/0230086 A1 | 8/2016 | Sato | |
| 2017/0343188 A1 | 11/2017 | Oshio | |
| 2018/0346808 A1* | 12/2018 | Nitta | C09K 11/7723 |

FOREIGN PATENT DOCUMENTS

| | | |
|---|---|---|
| JP | 2014-224231 A | 12/2014 |
| WO | 2006/135005 A1 | 12/2006 |
| WO | 2015/045260 A1 | 4/2015 |
| WO | 2016/092743 A1 | 6/2016 |

OTHER PUBLICATIONS

Written Opinion for corresponding Application No. PCT/JP2017/037649, dated Jan. 16, 2018.
International Preliminary Report of Patentability for corresponding Application No. PCT/JP2017/037649, dated Jan. 15, 2019.

* cited by examiner (a)

(b)

(c)

LIGHT-EMITTING DEVICE

TECHNICAL FIELD

The present invention relates to a light-emitting device. In detail, the present invention relates to a light-emitting device that can be suitably used for general lighting and special lighting and is capable of emitting output light having high color rendering properties.

BACKGROUND ART

Heretofore, there has been known a light-emitting device composed by combining a solid-state light-emitting element that radiates a laser beam and a wavelength converter including a plurality of types of $Ce^{3+}$-activated phosphors with each other. As such a light-emitting device as described above, for example, a laser illuminator and a laser projector, which are described in Patent Literature 1, have been known.

In a light-emitting device having a light source that applies a laser beam, generally, high-density photoexcitation of the phosphor is performed. Then, the light-emitting device of Patent Literature 1 can exhibit a high output since light emission of the phosphor is hard to be saturated even under the high-density photoexcitation.

CITATION LIST

Patent Literature

Patent Literature 1: International Publication No. WO 2016/092743

SUMMARY OF INVENTION

However, the light-emitting device composed by combining the solid-state light-emitting element that radiates a laser beam and the wavelength converter including only the $Ce^{3+}$-activated phosphor as a phosphor has had a problem that an intensity of output light in the vicinity of a wavelength of the laser beam is approximated to zero. Moreover, in the conventional light-emitting device that uses a laser beam and a phosphor, an intensity difference in a spectral distribution in a wavelength range that somewhat affects a luminosity function is large, and it has been difficult to obtain output light with high color rendering properties, which is suitable for general lighting.

The present invention has been made in consideration of such problems as described above, which are inherent in the prior art. Then, it is an object of the present invention to provide a light-emitting device capable of radiating light with high color rendering properties over a wide wavelength range.

In order to solve the above-described problems, a light-emitting device according to an aspect of the present invention includes: a solid-state light-emitting element that radiates a laser beam; and a wavelength converter including a plurality of types of phosphors which receive the laser beam and radiate light. The phosphors included in the wavelength converter are substantially composed of a $Ce^{3+}$-activated phosphor. Then, output light of the light-emitting device has a light component across a wavelength range of at least 420 nm or more and less than 700 nm.

BRIEF DESCRIPTION OF DRAWINGS

FIG. 5(a) illustrates a state of applying a phosphor coating liquid on a transparent substrate; FIG. 5(b) illustrates a state where a phosphor coating liquid dried body is formed on the transparent substrate; and FIG. 5(c) illustrates a state where a phosphor layer is formed on the transparent substrate.

DESCRIPTION OF EMBODIMENTS

Figure 1:
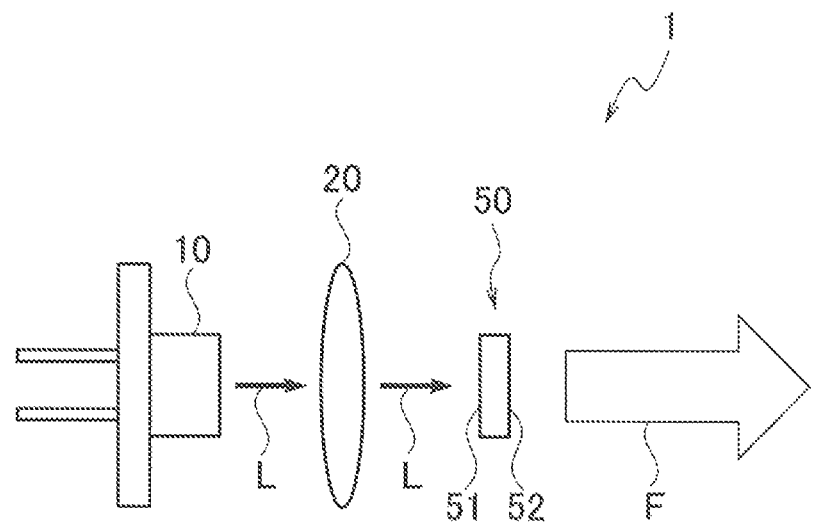
FIG. 1 is a schematic diagram illustrating a light-emitting device according to a first embodiment of the present invention.

Hereinafter, a detailed description will be given of a light-emitting device according to this embodiment. Note that dimensional ratios in the drawings are exaggerated for convenience of explanation, and are sometimes different from actual ratios.

As mentioned above, in the conventional light-emitting device composed by combining a solid-state light-emitting element and a wavelength converter including only a $Ce^{3+}$-activated phosphor as a phosphor, an intensity of output light in the vicinity of a wavelength of a laser beam is sometimes approximated to zero. As causes of the above, there are mentioned: that the $Ce^{3+}$-activated phosphor emits fluorescence in which a full width at half maximum of a spectrum is wide; that the $Ce^{3+}$-activated phosphor has a large intensity difference in a spectral distribution in a visible region; and further, that an intensity of a laser beam protrudes therein.

Moreover, improvement of an average color rendering index Ra of illumination light has had limitations if the technology using the conventional blue laser beam is only used. This is caused by the fact that a part of a light component emitted by a blue-green color-based phosphor is absorbed by a warm color-based phosphor since the $Ce^{3+}$-activated phosphor has characteristics in which a long wavelength end of an excitation spectrum and a short wavelength end of a fluorescence spectrum overlap each other.

In consideration of such a circumstance, a light-emitting device of this embodiment is a device that reduces an intensity difference in a spectral distribution in a wavelength range that affects a luminosity function and can be suitably used for general lighting and special lighting for which high color rendering properties are required.

First Embodiment

As illustrated in FIG. 1, a light-emitting device 1 according to a first embodiment includes: a solid-state light-emitting element 10 that radiates a laser beam L; and a wavelength converter 50 including a plurality of types of phosphors which receive the laser beam L and radiate light. Moreover, the light-emitting device 1 further includes a lens 20 that condenses, to the wavelength converter 50, the laser beam L radiated from the solid-state light-emitting element 10. The lens 20 is provided between the solid-state light-emitting element 10 and the wavelength converter 50. In the light-emitting device 1, the wavelength converter 50 radiates fluorescence F when the laser beam L radiated from the solid-state light-emitting element 10 is made incident onto the wavelength converter 50 via the lens 20.

The solid-state light-emitting element 10 is a light-emitting element that radiates the laser beam L. As such a solid-state light-emitting element, for example, a laser diode such as a surface-emitting laser diode is used.

To the wavelength converter 50, the lens 20 condenses the laser beam L radiated from the solid-state light-emitting element 10. Note that the lens 20 does not need to be provided in the light-emitting device 1 if is not necessary to condense the laser beam L to the wavelength converter 50. That is, the lens 20 is not an essential constituent for the light-emitting device 1. Moreover, an optical fiber is also usable in place of the lens 20 as in a light-emitting device 1A according to a second embodiment to be described later.

The wavelength converter 50 includes a plurality of types of phosphors which receive the laser beam L and radiate light. As illustrated in FIG. 1, the wavelength converter 50 receives the laser beam L, thereby radiating fluorescence F having a longer wavelength than the laser beam L. Note that, since the wavelength converter 50 illustrated in FIG. 1 is a first wavelength converter among first to third wavelength converters to be described later, the wavelength converter 50 is configured as illustrated in FIG. 1 to receive the laser beam L by a front surface 51 thereof and to radiate the fluorescence F from a back surface 52 thereof. In contrast, the second or third wavelength converter to be described later receives the laser beam L on a front surface thereof, and radiates the fluorescence F from the same front surface.

The light-emitting device 1 includes: the solid-state light-emitting element 10 that radiates the laser beam L; and the wavelength converter 50 including the plurality of types of phosphors which receive the laser beam L and radiate light. Moreover, the phosphors included in the wavelength converter 50 are substantially composed of a $Ce^{3+}$-activated phosphor. Then, output light of the light-emitting device 1 has a light component across a wavelength range of at least 420 nm or more and less than 700 nm. The light-emitting device 1 can emit light with a continuous spectrum in which an intensity difference in a spectral distribution is small, the light having a light component in a wavelength range of visible light in which a luminosity function is relatively high, that is, in a wavelength range of 420 to 700 nm. Therefore, the light-emitting device 1 radiates light close to natural light, and can be suitably used for general lighting and special lighting.

In the light-emitting device 1, the plurality of types of phosphors included in the wavelength converter 50 are substantially composed of the $Ce^{3+}$-activated phosphor. The phrase "substantially composed of the $Ce^{3+}$-activated phosphor" means that the phosphors are composed of only the $Ce^{3+}$-activated phosphor except phosphors mixed as impurities.

$Ce^{3+}$ is a light emission center that has the shortest light emission lifetime ($10^{-8}$ to $10^{-7}$ s) among rare earth ions, and accordingly, in the $Ce^{3+}$-activated phosphor, electron energy of the phosphor in an excited state is relaxed in an extremely short time. Therefore, in the $Ce^{3+}$-activated phosphor, the electron energy of the phosphor in an excited state can be relaxed in an extremely short time even under high-density photoexcitation caused by laser beam irradiation. Hence, when the $Ce^{3+}$-activated phosphor is used as the phosphor included in the wavelength converter 50, light emission saturation can be suppressed. Note that "light emission saturation" refers to a saturation phenomenon of a light output, which is caused by an increase of the number of electrons in the excited state.

Moreover, a stable valence of the rare earth ions is trivalence, and $Ce^{3+}$ is a light emission center that has such a stable valence that is trivalence. Therefore, even if the phosphor generates heat by the high-density photoexcitation due to the laser beam irradiation, the $Ce^{3+}$-activated phosphor is less likely to cause a quality degradation of phosphor crystals. Specifically, the $Ce^{3+}$-activated phosphor is less likely to cause a quality degradation of crystals due to oxidation of $Eu^{2+}$ in an $Eu^{2+}$-activated phosphor to $Eu^{3+}$ as in the $Eu^{2+}$-activated phosphor. Therefore, when the $Ce^{3+}$-activated phosphor is used as the phosphor included in the wavelength converter 50, long-term reliability thereof is increased.

As described above, the $Ce^{3+}$-activated phosphor can suppress the light emission saturation and has high long-term reliability, and accordingly, is suitable as a phosphor for the wavelength converter 50 for use in the light-emitting device 1 having a light source that applies a laser beam.

In the light-emitting device 1, it is preferable that the laser beam have the maximum intensity value within a wavelength range of 380 nm or more and less than 420 nm, and it is more preferable that the laser beam have the maximum intensity value within a wavelength range of 395 nm or more and less than 415 nm. In this way, the light-emitting device 1 becomes capable of exciting a $Ce^{3+}$-activated phosphor that emits at least blue color-based fluorescence, that is, blue or blue-green fluorescence. Therefore, the light-emitting device 1 becomes capable of emitting a blue-based fluorescent component brought about by $Ce^{3+}$, where a full width at half maximum of a fluorescence spectrum is wide.

It is preferable that the plurality of types of phosphors include: a first phosphor that emits first fluorescence having the maximum intensity value within a wavelength range of 435 nm or more and less than 500 nm; and a second phosphor that emits second fluorescence having the maximum intensity value within a wavelength range of 580 nm or more and less than 630 nm. In this way, the wavelength converter 50 will contain the blue-based $Ce^{3+}$-activated phosphor and the warm color-based $Ce^{3+}$-activated phosphor, which are capable of emitting a fluorescence spectrum having a full width at half maximum as wide as approximately 100 nm. Therefore, the light-emitting device 1 becomes capable of emitting output light having the light component across the wavelength range of at least 420 nm or more and less than 700 nm. Note that "blue-based $Ce^{3+}$-activated phosphor" refers to a $Ce^{3+}$-activated phosphor that emits blue or blue-green fluorescence, and "warm color-based $Ce^{3+}$-activated phosphor" refers to a $Ce^{3+}$-activated phosphor that emits yellow, orange or red fluorescence. Moreover, it is more preferable that the first phosphor emit first fluorescence having a maximum intensity value within a wavelength range of 440 nm or more and less than 490 nm. It is more preferable that the second phosphor emit second fluorescence having a maximum intensity value within a wavelength range of 590 nm or more and less than 620 nm.

In the light-emitting device 1, it is preferable that the plurality of types of phosphors further include a third phosphor that emits third fluorescence having the maximum intensity value within a wavelength range of 500 nm or more and less than 580 nm. In this way, the output light of the light-emitting device 1 will have a green-based light component, and accordingly, it becomes possible to sharpen appearance of green in an irradiated object. Moreover, the output light will have a light component with a high luminosity function, and accordingly, the light-emitting device 1 becomes capable of obtaining output light with a high luminous flux.

As described above, the light-emitting device 1 radiates much demanded white output light by additive color mixture of a blue or blue-green light component; a yellow, orange or red-light component; and a green light component to be added according to needs. Moreover, a spectral distribution of a wavelength range of at least 420 nm to 700 nm is composed by using a light component with a wide full width at half maximum of a fluorescence spectrum, which is caused by electron energy transition of $Ce^{3+}$. Therefore, the light-emitting device 1 becomes capable of obtaining white output light with a large average color rendering index Ra.

Note that, in the light-emitting device 1, the phosphor in the wavelength converter 50 may contain a $Ce^{3+}$-activated phosphor that receives the laser beam from the solid-state light-emitting element 10 and radiates light having a light emission peak within a wavelength range of 480 nm or more and less than 520 nm. Moreover, the phosphor may contain a $Ce^{3+}$-activated phosphor that receives the laser beam from the solid-state light-emitting element 10 and radiates light having a light emission peak within a wavelength range of 480 nm or more and less than 500 nm. As such a $Ce^{3+}$-activated phosphor as described above, a blue-green-based $Ce^{3+}$-activated phosphor or a green-based $Ce^{3+}$-activated phosphor can be used.

In the light-emitting device 1, with regard to an excitation spectrum of the second phosphor, an intensity thereof at a wavelength of 420 nm may be larger than an intensity thereof at a wavelength where the laser beam L reaching the maximum intensity. Moreover, it is preferable that the first phosphor be excited by the laser beam L, and that the second phosphor be excited by at least the first phosphor. That is, for example, when the wavelength at which the laser beam L reaches the maximum intensity is 405 nm, then with regard to the excitation spectrum of the second phosphor, the intensity thereof at the wavelength of 420 nm may be larger than an intensity thereof at the wavelength of 405 nm. In this case, increased is a possibility that the emission spectrum of the first phosphor and the excitation spectrum of the second phosphor may overlap each other. Then, when such a second phosphor as described above is used, the first phosphor will be excited by the laser beam L, and the second phosphor will be excited by the fluorescence emitted by the first phosphor. Therefore, even if the second phosphor is a phosphor that is hardly excited by the laser beam L, interposition of the first phosphor makes it possible to excite the second phosphor by the fluorescence emitted by the first phosphor.

Note that the excitation spectrum of the second phosphor does not need to have the maximum intensity value within the wavelength range of 380 nm or more and less than 420 nm. Alternatively, the second phosphor may be a phosphor in which an intensity of an excitation spectrum at the wavelength of 420 nm does not reach ⅕ of the maximum intensity value of the excitation spectrum within the wavelength range of 435 nm or more and less than 500 nm. Alternatively, the second phosphor may be a phosphor in which an intensity of an excitation spectrum at the wavelength of 420 nm does not reach ⅒ of the maximum intensity value of the excitation spectrum within the wavelength range of 435 nm or more and less than 500 nm. That is, the second phosphor may be a phosphor that is not excited highly efficiently by the laser beam. In this way, even if the second phosphor is a phosphor that is hardly excited by the laser beam, interposition of the first phosphor makes it possible to excite the second phosphor by the first fluorescence.

In the light-emitting device 1, it is preferable that the first phosphor be a $Ce^{3+}$-activated phosphor composed based on a compound (a) containing, as a main component, at least one selected from the group consisting of alkaline earth metal oxide, alkaline earth metal halo-aluminate, rare earth aluminate, rare earth oxynitride alumino-silicate, and rare earth aluminonitride silicate, each of which has a calcium ferrite-type structure. Alternatively, it is more preferable that the first phosphor be a $Ce^{3+}$-activated phosphor composed based on at least one selected from the group consisting of alkaline earth metal oxide, alkaline earth metal halo-aluminate, rare earth aluminate, rare earth oxynitride alumino-silicate, and rare earth aluminonitride silicate, each of which has a calcium ferrite-type structure. In this way, a part of the laser beam having the maximum intensity value within the wavelength range of 380 nm or more and less than 420 nm becomes convertible into a blue-based light component, and the blue-based light component in which a full width at half maximum of a fluorescence spectrum is large becomes obtainable.

Specifically, it is preferable that the first phosphor be a $Ce^{3+}$-activated phosphor composed based on a compound (b) containing, as a main component, at least one selected from the group consisting of $MRE_2O_4$, $M_3AlO_4F$, $M_2REX_2(AlO_4)_3$, $REAl(Si_{6-z}Al_z)(N_{10-z}O_z)$, and $RE_3Si_3N_5$. Alternatively, it is preferable that the first phosphor be a $Ce^{3+}$-activated phosphor composed based on at least one selected from the group consisting of $MRE_2O_4$, $M_3AlO_4F$, $M_2REX_2(AlO_4)_3$, $REAl(Si_{6-z}Al_z)(N_{10-z}O_z)$, and $RE_3Si_3N_5$. Alternatively, it is preferable that the first phosphor be a $Ce^{3+}$-activated phosphor composed based on a solid solution containing the compound (b) as an end member. Note that M is alkaline earth metal, RE is a rare earth element, X is at least either one of Zr and Hf, and z is a numerical value that satisfies $0 \le z < 1$.

More specifically, for example, it is preferable that the first phosphor be a $Ce^{3+}$-activated phosphor composed based on a compound containing, as a main component, at least one selected from the group consisting of $SrLu_2O_4$, $SrSc_2O_4$, $Sr_3AlO_4F$, $Ca_2YZr_2(AlO_4)_3$, $LaAlSi_6N_{10}$, and $La_3Si_3N_5$. Alternatively, it is preferable that the first phosphor be a $Ce^{3+}$-activated phosphor based on at least one selected from the group consisting of $SrLu_2O_4$, $SrSc_2O_4$, $Sr_3AlO_4F$, $Ca_2YZr_2(AlO_4)_3$, $LaAlSi_6N_{10}$, and $La_3Si_3N_5$. Alternatively, it is preferable that the first phosphor be a $Ce^{3+}$-activated phosphor composed on a solid solution containing, as an end member, at least one selected from the group consisting of $SrLu_2O_4$, $SrSc_2O_4$, $Sr_3AlO_4F$, $Ca_2YZr_2(AlO_4)_3$, $LaAlSi_6N_{10}$, and $La_3Si_3N_5$.

Such a phosphor as described above can efficiently absorb light within the wavelength range of 380 nm or more and less than 420 nm, and can convert the absorbed light into the blue-based light having the maximum intensity value within the wavelength range of 435 nm or more and less than 500 nm highly efficiently. Therefore, such a phosphor as described above is used as the first phosphor, whereby it becomes easy to obtain a blue to blue-green light component.

In the light-emitting device 1, it is preferable that the second phosphor be a $Ce^{3+}$-activated phosphor composed based on a compound (c) containing, as a main component, at least one selected from the group consisting of rare earth silicate, rare earth aluminate, rare earth alumino-silicate, alkaline earth metal aluminonitride silicate, and rare earth nitride silicate. Alternatively, it is preferable that the second phosphor be a $Ce^{3+}$-activated phosphor composed based on at least one selected from the group consisting of rare earth silicate, rare earth aluminate, rare earth alumino-silicate, alkaline earth metal aluminonitride silicate, and rare earth nitride silicate. Such a second phosphor as described above is used, whereby a part of fluorescence emitted by the first phosphor becomes convertible into a warm color-based light component. Therefore, a warm color-based light component in which a full width at half maximum of a fluorescence spectrum is large becomes obtainable.

Specifically, it is preferable that the second phosphor be a $Ce^{3+}$-activated phosphor composed based on a compound (d) containing, as a main component, at least one selected from the group consisting of $RE_2MMg(SiO_4)_3$, $RE_3Al_2(AlO_4)_3$, $RE_3Mg_2(SiO_4)_2(AlO_4)$, $MAlSiN_3$, and $RE_3Si_6N_{11}$. Alternatively, it is preferable that the second phosphor be a $Ce^{3+}$-activated phosphor composed based on at least one selected from the group consisting of $RE_2MMg(SiO_4)_3$, $RE_3Al_2(AlO_4)_3$, $RE_3Mg_2(SiO_4)_2(AlO_4)$, $MAlSiN_3$, and $RE_3Si_6N_{11}$. Alternatively, it is preferable that the second phosphor be a $Ce^{3+}$-activated phosphor composed based on a solid solution containing the compound (d) as an end member. Note that M is alkaline earth metal, and RE is a rare earth element.

More specifically, for example, it is preferable that the second phosphor be a $Ce^{3+}$-activated phosphor composed based on a compound containing, as a main component, at least one selected from the group consisting of $Lu_2CaMg(SiO_4)_3$, $(Y,Gd)_3Al_2(AlO_4)_3$, $Y_3Mg_2(SiO_4)_2(AlO_4)$, $CaAlSiN_3$, and $La_3Si_6N_{11}$. Alternatively, it is preferable that the second phosphor be a $Ce^{3+}$-activated phosphor composed based on at least one selected from the group consisting of $Lu_2CaMg(SiO_4)_3$, $(Y,Gd)_3Al_2(AlO_4)_3$, $Y_3Mg_2(SiO_4)_2(AlO_4)$, $CaAlSiN_3$, and $La_3Si_6N_{11}$. Alternatively, it is preferable that the second phosphor be a $Ce^{3+}$-activated phosphor composed based on a solid solution containing, as an end member, at least one selected from the group consisting of $Lu_2CaMg(SiO_4)_3$, $(Y,Gd)_3Al_2(AlO_4)_3$, $Y_3Mg_2(SiO_4)_2(AlO_4)$, $CaAlSiN_3$, and $La_3Si_6N_{11}$.

Such a phosphor as described above efficiently absorbs light within the wavelength range of 435 nm or more and less than 500 nm, and can convert the absorbed light into the warm color-based light having the maximum intensity value within the wavelength range of 580 nm or more and less than 630 nm highly efficiently. Therefore, such a phosphor as described above is used as the second phosphor, whereby an orange to red light component becomes easily obtainable.

Note that the second phosphor advantageous in terms of temperature quenching is the $Ce^{3+}$-activated phosphor composed based on the compound containing either $Lu_2CaMg(SiO_4)_3$ or $CaAlSiN_3$ as a main component, or based on a solid solution containing this compound as an end member.

In the light-emitting device 1, it is preferable that the second phosphor have the maximum intensity value of the excitation spectrum within the wavelength range of 435 nm or more and less than 500 nm, and it is more preferable that the second phosphor have the maximum intensity value within the wavelength range of 440 nm or more and less than 490 nm. In this way, a part of fluorescence emitted by the first phosphor becomes highly efficiently convertible into a warm color-based light component by the second phosphor.

In the light-emitting device 1, when a peak wavelength of the fluorescence spectrum of the first phosphor is $\lambda_{em}$, and a peak wavelength of the excitation spectrum of the second phosphor is $\lambda_{ex}$, a difference between $\lambda_{em}$ and $\lambda_{ex}$ is preferably 20 nm or less, more preferably 10 nm or less. In this way, the fluorescence emitted by the first phosphor efficiently excites the second phosphor, and makes it possible to easily obtain the warm color-based light component. Meanwhile, with regard to a light component with a high fluorescence intensity, which is emitted by the first phosphor, light absorption efficiency thereof to the second phosphor is increased, and with regard to a light component with a low fluorescence intensity, which is emitted by the first phosphor, light absorption efficiency thereof to the second phosphor is reduced. Therefore, wavelength dependency of an interference effect by the second phosphor is equalized, and the blue-based light component by the first phosphor becomes easily obtainable.

In the light-emitting device 1, it is preferable that the third phosphor be a $Ce^{3+}$-activated phosphor composed based on a compound (e) containing, as a main component, a compound having a garnet-type or calcium ferrite-type crystal structure. Alternatively, it is preferable that the third phosphor be a $Ce^{3+}$-activated phosphor composed based on a compound having a garnet-type or calcium ferrite-type crystal structure. Such a third phosphor as described above, whereby output light with a high luminosity function, which has a large amount of green-based light component, becomes obtainable.

Specifically, it is preferable that the third phosphor be a $Ce^{3+}$-activated phosphor composed based on a compound (e) containing, as a main component, at least one selected from the group consisting of $M_3RE_2(SiO_4)_3$, $RE_3Al_2(AlO_4)_3$, and $MRE_2O_4$. Alternatively, it is preferable that the third phosphor be a $Ce^{3+}$-activated phosphor composed based on at least one selected from the group consisting of $M_3RE_2(SiO_4)_3$, $RE_3Al_2(AlO_4)_3$, and $MRE_2O_4$. Alternatively, it is preferable that the third phosphor be a $Ce^{3+}$-activated phosphor composed based on a solid solution containing the compound (e) as an end member. Note that M is alkaline earth metal, and RE is a rare earth element.

More specifically, for example, it is preferable that the third phosphor be a $Ce^{3+}$-activated phosphor composed based on a compound containing, as a main component, at least one selected from the group consisting of $Ca_3Sc_2(SiO_4)_3$, $Lu_3Al_2(AlO_4)_3$, $Y_3(Ga,Al)_2(AlO_4)_3$, $Y_3Al_2(AlO_4)_3$, $Ca_3Sc_2O_4$. Alternatively, it is preferable that the third phosphor be a $Ce^{3+}$-activated phosphor composed based on at least one selected from the group consisting of $Ca_3Sc_2(SiO_4)_3$, $Lu_3Al_2(AlO_4)_3$, $Y_3(Ga,Al)_2(AlO_4)_3$, $Y_3Al_2(AlO_4)_3$, $Ca_3Sc_2O_4$. Alternatively, it is preferable that the third phosphor be a $Ce^{3+}$-activated phosphor composed based on a solid solution containing, as an end member, at least one selected from the group consisting of $Ca_3Sc_2(SiO_4)_3$, $Lu_3Al_2(AlO_4)_3$, $Y_3(Ga,Al)_2(AlO_4)_3$, $Y_3Al_2(AlO_4)_3$, $Ca_3Sc_2O_4$.

Such a phosphor as described above efficiently absorbs light within the wavelength range of 435 nm or more and less than 500 nm, and can convert the absorbed light into a green-based light having the maximum intensity value within a wavelength range of 510 nm or more and less than 560 nm highly efficiently. Therefore, such a phosphor as described above is used as the third phosphor, whereby a green light component becomes easily obtainable.

In the light-emitting device 1, it is preferable that the wavelength converter 50 be an inorganic material. Herein, the inorganic material means a material other than organic materials, and is a concept involving ceramics and metals. Note that organic siloxane in which a part of siloxane is substituted for an organic functional group such as an alkyl group is also defined as an inorganic material. The wavelength converter 50 is made of an inorganic material, whereby thermal conductivity thereof is increased in comparison with a conventional wavelength converter including an organic material such as a sealing resin, and accordingly, heat dissipation design can be easily prepared. Therefore, even if the phosphor is subjected to high-density photoexcitation by the laser beam L radiated from the solid-state light-emitting element 10, a temperature rise of the wavelength converter 50 can be suppressed effectively. As a result, temperature quenching of the phosphor in the wavelength converter 50 is suppressed, and it becomes possible to increase the output of the light emission.

A specific configuration of the wavelength converter 50 made of such an inorganic material includes a plurality of types. For example, the configuration includes: a configuration including a transparent substrate and a phosphor layer (first wavelength converter); a configuration including a metal substrate and a phosphor layer (second wavelength converter); a configuration made of translucent phosphor ceramics fabricated by sintering a phosphor (third wavelength converter); and the like. Moreover, also in the first wavelength converter, the transparent substrate may include the phosphor, or may not include the phosphor.

Figure 2:
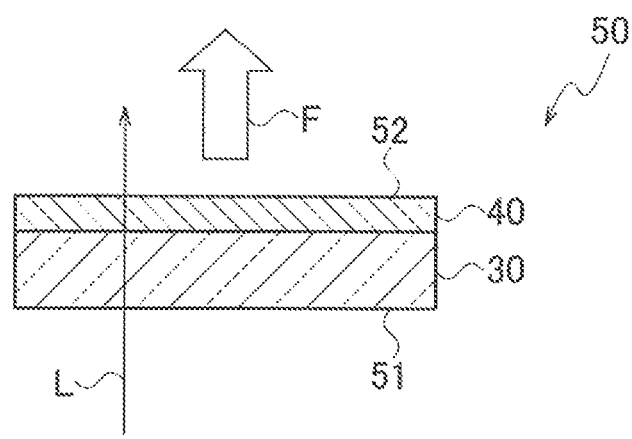
FIG. 2 is a cross-sectional view illustrating an example of a wavelength converter.

FIG. 2 is a cross-sectional view illustrating an example of the first wavelength converter 50 that constitutes the light-emitting device 1 illustrated in FIG. 1. The first wavelength converter 50 includes: a transparent substrate 30 through which a laser beam transmits; and a phosphor layer 40 that is formed on a surface of the transparent substrate 30 and includes a phosphor. Then, the phosphor layer 40 includes a phosphor and an inorganic adhesive that adheres the phosphor and the transparent substrate 30 to each other.

As illustrated in FIG. 2, the wavelength converter 50 includes: the transparent substrate 30 through which a laser beam transmits; and the phosphor layer 40 that is formed on a surface of the transparent substrate 30 and includes a phosphor. The wavelength converter 50 includes a plurality of types of phosphors. When the transparent substrate 30 does not include the phosphor, the phosphor layer 40 includes a plurality of types of phosphors. When the transparent substrate 30 includes the phosphor, the phosphor layer 40 includes one or more types of the phosphors. In the wavelength converter 50, the laser beam L is made incident thereonto from the front surface 51 as a surface of the transparent substrate 30, and the fluorescence F is radiated from the back surface 52 as a surface of the phosphor layer 40.

The transparent substrate 30 has transparency that enables the laser beam L to transmit therethrough, and the laser beam L made incident from the front surface 51 as a surface of the transparent substrate 30 transmits through the transparent substrate 30. As the transparent substrate 30, for example, a quartz substrate, a sapphire substrate, or a translucent phosphor ceramic substrate is used. Herein, the translucent phosphor ceramic substrate is a ceramic substrate that includes a phosphor and has translucency. When the transparent substrate 30 is a translucent phosphor ceramic substrate, the transparent substrate 30 includes a phosphor, and accordingly, the phosphor layer 40 will be a layer including one or more phosphors. The laser beam L that has transmitted through the transparent substrate 30 is introduced into the phosphor layer 40. Note that, when the transparent substrate 30 includes a phosphor, not only the laser beam L but also the fluorescence F is radiated from the transparent substrate 30.

The phosphor layer 40 includes a phosphor and an inorganic adhesive that adheres the phosphor and the transparent substrate 30 to each other. In the phosphor layer 40, the phosphor that has received the laser beam L radiates fluorescence.

In the phosphor layer 40, the phosphor is adhered by an inorganic adhesive. As the inorganic adhesive, a translucent inorganic adhesive is used. As the translucent inorganic adhesive, for example, ultrafine particulate alumina, silica, low-melting-point glass or the like is used.

In the light-emitting device 1, a light density of the laser beam L applied to the wavelength converter 50 can be set to at least 2 W/mm$^2$ or more, and can also be set to 2 W/mm$^2$ or more and less than 15 W/mm$^2$, which is considered preferable for use in general lighting. The light density can also be set to 10 W/mm$^2$ or more and less than 50 W/mm$^2$, which is considered preferable for use in medical lighting. The light density can also be set to a value exceeding 40 W/mm$^2$ or more, which is considered preferable for use in a projector. In the light-emitting device 1, light emission saturation of the phosphor is not observed in evaluation of a light density up to at least 60 W/mm$^2$ or more, and accordingly, it is expected that the light density of the laser beam L can be set to less than 100 W/mm$^2$.

All of the $Ce^{3+}$-activated phosphors included in the wavelength converter 50 are preferably oxide-based phosphors, more preferably oxide phosphors. Therefore, it is preferable that all of the $Ce^{3+}$-activated phosphors included in the phosphor layer 40 be also oxide-based phosphors. Note that the oxide-based phosphors refer to phosphors which contain oxygen but do not contain nitrogen, and for example, there can be mentioned alkaline earth metal oxide, alkaline earth metal halo-aluminate, and rare earth aluminate, each of which has a calcium ferrite-type structure.

Oxides are stable substances in the atmosphere, and accordingly, when the oxide phosphors generate heat due to the high-density photoexcitation by the laser beam, such a quality degradation of phosphor crystals as caused in nitride phosphors, which may be caused by oxidation in the atmosphere, is less likely to occur. Therefore, when all of the phosphors included in the wavelength converter 50 are the oxide phosphors, long-term reliability of the light-emitting device 1 is increased.

Moreover, all of the $Ce^{3+}$-activated phosphors included in the wavelength converter are also preferably nitride-based phosphors, more preferably nitride phosphors or oxynitride phosphors. Therefore, it is preferable that all of the $Ce^{3+}$-activated phosphors included in the phosphor layer 40 be also nitride-based phosphors.

Nitrides have strong covalent bonding properties, and can take a variety of modified examples in terms of composition, and accordingly, can also easily control a fluorescent color and improve temperature quenching. Moreover, nitrides are also excellent in thermal conductivity, and accordingly, are also advantageous in miniaturization of the light-emitting device. Therefore, when all of the phosphors included in the wavelength converter 50 are the nitride-based phosphors, color tone control of the light emitted by the light-emitting device 1 is easy, and it also becomes easy to design a small device.

Moreover, it is also preferable that the $Ce^{3+}$-activated phosphors included in the wavelength converter 50 contain a phosphor having a garnet structure. Moreover, it is also preferable that all of the $Ce^{3+}$-activated phosphors included in the wavelength converter 50 be oxide phosphors, each of which has the garnet structure. Moreover, it is preferable that the $Ce^{3+}$-activated phosphors included in the phosphor layer 40 include a phosphor having the garnet structure. Moreover, it is also preferable that all of the $Ce^{3+}$-activated phosphors included in the phosphor layer 40 be oxide phosphors, each of which has the garnet structure.

The phosphors having the garnet structure, and particularly the oxides have a particle shape of a polyhedron close to a sphere, and are excellent in dispersibility for a group of phosphor particles. Therefore, when the $Ce^{3+}$-activated phosphors included in the wavelength converter 50 are phosphors, each of which has the garnet structure, then a wavelength converter excellent in light transmissivity becomes relatively easily producible, and it becomes easy to increase the output.

As mentioned above, for the output light, the light-emitting device 1 of this embodiment uses only light emission components, which are derived from $Ce^{3+}$, as light emission components by the phosphors. In this way, the light emission components of the phosphors exhibit ultrashort afterglow ($10^{-8}$ to $10^{-7}$ s, that is, 10 ns or more and 100 ns or less), and the light emission saturation under high-density photoexcitation by the laser beam irradiation can be suppressed. Note that "light emission components derived from $Ce^{3+}$" refer to light emission components emitted following energy relaxation from the $5d^1$ electronic state (excited state) to the $4f^1$ electronic state (ground state), the energy relaxation being intrinsic to $Ce^{3+}$.

Incidentally, in technical books, a large number of examples are illustrated regarding emission spectrum shapes intrinsic to activators (light emission centers). Then, each of "light emission components derived from $Ce^{3+}$" is a light emission component that has a unique emission spectrum shape formed in such a manner that two broad light emission components having different peak wavelengths overlap each other. In other words, each of "light emission components derived from $Ce^{3+}$" is a light emission component that has a shape having a sub-peak or a shoulder on a long wavelength side of a broad main emission spectrum component. This unique shape results from allowed transition in which the light emission component derived from $Ce^{3+}$ causes energy relaxation from one excited level ($^2D(5d^1)$) to two ground levels ($^2F_J(4f^1)$, J=5/2, 7/2). Moreover, this shape results from the fact that 5d electrons on the outermost shell, which are apt to be affected by a crystal field, involve the excited level.

In the light-emitting device of this embodiment, a plurality of "light emission components derived from $Ce^{3+}$" are obtained, and accordingly, the above-described unique shape is not determined in many cases. However, it becomes possible to determine the above-described unique shape by using elemental analysis of the wavelength converter in combination.

Among the $Ce^{3+}$-activated phosphors, there are known some co-activation-type phosphors, which co-activate ions such as $Tb^{3+}$, $Eu^{2+}$ and $Mn^{2+}$, which are other than $Ce^{3+}$, as a light emission center, and emit a light emission component derived from the ions other than $Ce^{3+}$. Many of these co-activation-type phosphors emit at least "bright line-shaped light emission component derived from $Tb^{3+}$" and "broad light emission component derived from $Eu^{2+}$ or $Mn^{2+}$ and having a single peak wavelength". However, the light-emitting device of this embodiment does not substantially use the co-activation-type phosphors as described above.

Herein, generally, with regard to the warm color-based $Ce^{3+}$-activated phosphor, a Stokes shift thereof and temperature quenching thereof are larger than in $Ce^{3+}$-activated phosphors which have other light emission colors, such as a green-based $Ce^{3+}$-activated phosphor. Therefore, heretofore, it has been difficult to use the warm color-based $Ce^{3+}$-activated phosphor for a light-emitting device including a light source such as a laser beam source, in which excitation energy is so large that a temperature of the phosphor rises easily. In contrast, in the light-emitting device 1, the wavelength converter 50 may be made of an inorganic material, and accordingly, heat dissipation of the wavelength converter 50 is higher than that of a wavelength converter including the conventional organic material. Therefore, in the light-emitting device 1, the warm color-based $Ce^{3+}$-activated phosphor can be used.

Then, the warm color-based $Ce^{3+}$-activated phosphor can receive the laser beam L from the solid-state light-emitting element 10 and radiate light having a light emission peak within the wavelength range of 580 nm or more and less than 630 nm. As such a warm color-based $Ce^{3+}$-activated phosphor, for example, an orange or red-based $Ce^{3+}$-activated phosphor that has the above-described garnet structure is used.

Note that, with regard to a $Ce^{3+}$-activated phosphor that has a light emission color shorter in wavelength than other light emission color than that of the warm color-based $Ce^{3+}$-activated phosphor, and specifically, the orange color, a Stokes shift and temperature quenching thereof are smaller than in the warm color-based $Ce^{3+}$-activated phosphor. Therefore, in the $Ce^{3+}$-activated phosphor that has a light emission color shorter in wavelength than orange, the problem of temperature quenching is less apt to occur. Accordingly, in the light-emitting device 1, it is possible to use the $Ce^{3+}$-activated phosphors as all of the phosphors including the warm color-based phosphor. Since it is possible to use the $Ce^{3+}$-activated phosphors as all of the phosphors as described above, the problem of temperature quenching is less apt to occur in the light-emitting device 1, which has a high light emission intensity and high long-term reliability.

It is preferable that the phosphors included in the wavelength converter 50 be powder since the glare in the output light emitted from the light-emitting device 1, the glare being caused by the laser beam, is relaxed. That is, it is preferable that the phosphors included in the wavelength converter 50 be powder since the glare of the output light emitted from the light-emitting device 1 is relaxed.

The laser beam is coherent light in which a phase relationship of light waves at arbitrary two points in a luminous flux is temporarily fixed. Therefore, an unnatural glare called "speckle" is apt to occur due to an occurrence of light interference. Since this unnatural glare gives displeasure to a light viewer, preferably, this glare is not present in the illumination light. When the phosphors included in the phosphor layer 40 are powder, the laser beam is scattered by a light scattering function of the phosphors, and accordingly, the glare of the output light from the light-emitting device 1 is relaxed.

Note that, in the phosphors included in the wavelength converter 50, preferably, an average particle size thereof is 3 μm to 100 μm. The matter that the average particle size of the phosphors stays within this range makes it possible to effectively relax the glare of the output light emitted from the light-emitting device 1. Note that the average particle size of the phosphors included in the wavelength converter 50 can be obtained by measuring a cross section of the wavelength converter 50 by a scanning electron microscope.

Functions of the light-emitting device 1 according to the first embodiment will be described. Note that, for convenience of explanation, a description will be given of the case where the transparent substrate 30 does not include the phosphor but the phosphor layer 40 includes the plurality of types of phosphors.

First, as illustrated in FIG. 1, the laser beam L radiated from the solid-state light-emitting element 10 is condensed to the wavelength converter 50 via the lens 20. As illustrated in FIG. 2, the laser beam L applied to the wavelength converter 50 transmits through the transparent substrate 30 and the phosphor layer 40. Moreover, at the time when the laser beam L transmits through the phosphor layer 40, the phosphors included in the phosphor layer 40 radiate the fluorescence F. In this way, the light-emitting device 1 radiates, as output light, light including laser beam L and the fluorescence F. Note that, though FIG. 1 illustrates that the wavelength converter 50 radiates only the fluorescence F, the wavelength converter 50 may also radiate the laser beam L when the laser beam L transmits through the wavelength converter 50. For example, if the laser beam L is a violet laser beam, and the fluorescence F is blue-green light and orange light, white-based output light is obtained by additive color mixture of blue-green light and orange light. Note that it is preferable that the fluorescence F include blue-green light since good color rendering properties are brought about. Moreover, when the transparent substrate 30 is a translucent phosphor ceramic substrate including the phosphors and having translucency, the fluorescence F is also radiated from the transparent substrate 30.

It is preferable that the light-emitting device 1 radiate output light with a correlated color temperature (Tc) of 2500 K or more and less than 7000 K. Moreover, more preferably, the light-emitting device 1 radiates output light with a correlated color temperature (Tc) of 2700 K or more and less than 5500 K, still more preferably, the light-emitting device 1 radiates output light with a correlated color temperature (Tc) of 3000 K or more and less than 4000 K. When the correlated color temperature of the output light of the light-emitting device 1 stays within the above-described range, such a light-emitting device 1 that radiates light preferred as illumination light is obtained. As a method for setting the correlated color temperature of the output light of the light-emitting device 1 within the above-described range, there is used a method of selecting the laser beams L different in wavelength range, or a method of adjusting types or amounts of the plurality of types of phosphors included in the wavelength converter 50.

It is desirable that the light-emitting device 1 radiate output light with an average color rendering index Ra of 80 or more and less than 98. When the average color rendering index Ra of the output light of the light-emitting device 1 stays within the above-described range, such a light-emitting device 1 that radiates light that has high color rendering properties and is preferred as illumination light is obtained. As a method for setting the average color rendering index Ra of the output light of the light-emitting device 1 within the above-described range, there is used a method of selecting the laser beams L different in wavelength range, or a method of adjusting types or amounts of the plurality of types of phosphors included in the wavelength converter 50.

Next, a description will be given of a method for manufacturing the wavelength converter 50. First, the transparent substrate 30 is prepared, and the phosphor coating liquid to be coated on the surface of the transparent substrate 30 is prepared. For example, the phosphor coating liquid includes a solvent, a thickener, an inorganic adhesive, and the phosphor. As the solvent, for example, distilled water is used. As the thickener, for example, polyethylene oxide (PEO) is used. As the inorganic adhesive, for example, ultrafine particulate alumina is used.

For example, the phosphor coating liquid is prepared by dissolving the thickener in the solvent, thereafter further adding the phosphor and the inorganic adhesive thereto in this order, and stirring an obtained mixture. When the phosphor coating liquid includes a plurality of types of the phosphors, the phosphor coating liquid includes a blue phosphor and an orange phosphor for example. A blended quantity of each of the phosphors in the phosphor coating liquid is adjusted, whereby a color tone of the light emitted from the wavelength converter can be adjusted. Moreover, mixed quantities of the phosphors and the distilled water are changed, whereby viscosity of the phosphor coating liquid can be adjusted, and a thickness of the phosphor layer can be adjusted.

Figure 3:
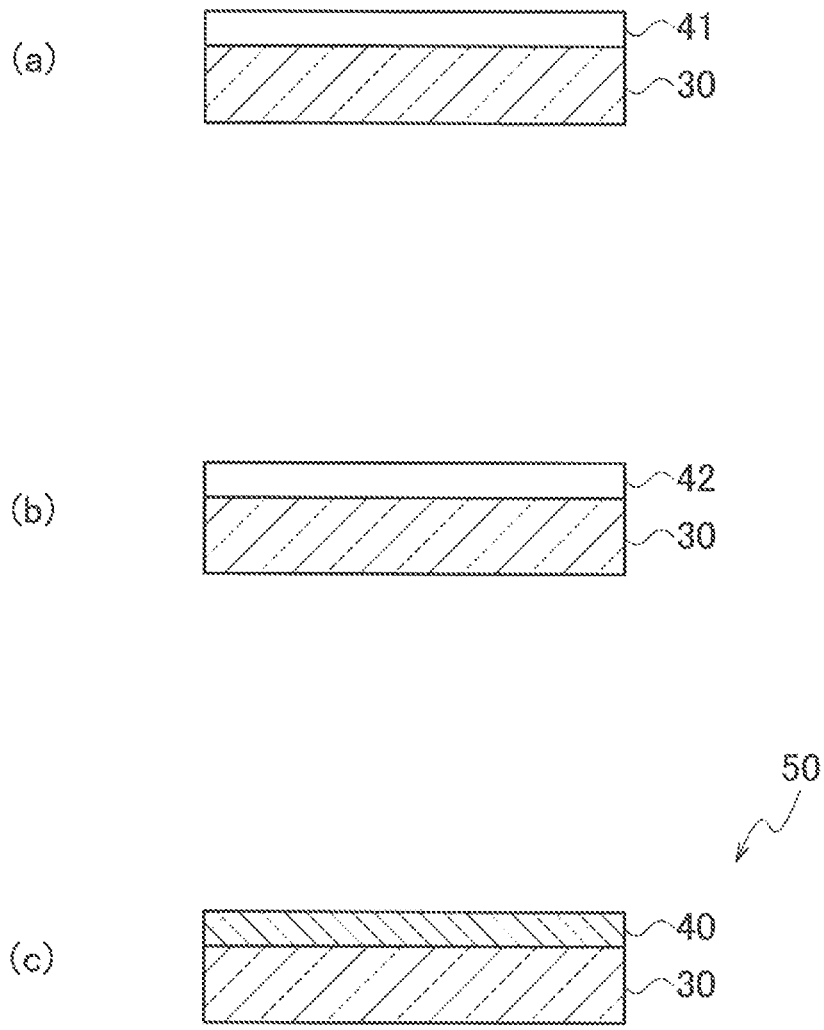
FIG. 3 is diagrams explaining a manufacturing process of the wavelength converter.

Next, as illustrated in FIG. 3(a), the phosphor coating liquid is dropped onto the surface of the transparent substrate 30, and is left, whereby a phosphor coating liquid layer 41 is formed on the surface of the transparent substrate 30. Moreover, as illustrated in FIG. 3(b), the phosphor coating liquid layer 41 is left, for example, in a heated environment of 40 to 80° C. for 5 to 30 minutes to dry the phosphor coating liquid layer 41, whereby a phosphor coating liquid dried body layer 42 is formed. Next, the transparent substrate 30 on the surface of which the phosphor coating liquid dried body layer 42 is formed is heated to a burnout temperature of the thickener or more, for example, to approximately 600° C. In this way, the thickener is burnt out, and as illustrated in FIG. 3(c), the phosphor layer 40 having translucency is formed on the surface of the transparent substrate 30, and the wavelength converter 50 is obtained.

First Modified Example in First Embodiment

A description will be given of a first modified example in the first embodiment. In the first modified example, a wavelength converter 50A as a second wavelength converter is substituted for the wavelength converter 50 of the light-emitting device 1 according to the first embodiment.

Figure 4:
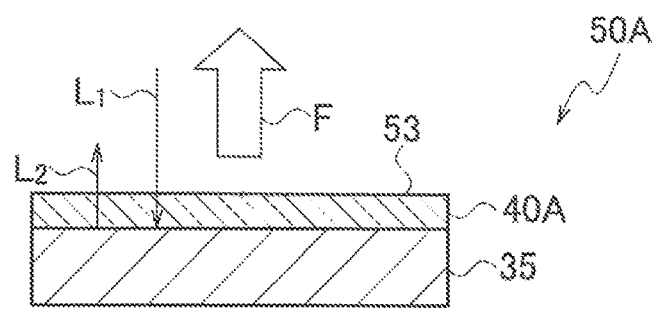
FIG. 4 is a cross-sectional view illustrating a first modified example of the wavelength converter.

FIG. 4 is a cross-sectional view illustrating an example of the second wavelength converter 50A. The second wavelength converter 50A according to this embodiment includes: a metal substrate 35 on which a laser beam $L_1$ is reflected; and a phosphor layer 40A that is formed on a surface of the metal substrate 35 and includes a phosphor. The phosphor layer 40A includes a phosphor and an inorganic adhesive that adheres the phosphor to the metal substrate 35.

As illustrated in FIG. 4, the wavelength converter 50A includes: the metal substrate 35 on which the laser beam $L_1$ is reflected; and the phosphor layer 40A that is formed on the surface of the metal substrate 35 and includes a phosphor. In the wavelength converter 50A, the laser beam $L_1$ is made incident thereonto from a front surface 53 as a surface of the phosphor layer 40A, and the laser beam $L_1$ is reflected on an interface between the phosphor layer 40A and the metal substrate 35, and becomes a laser beam $L_2$. Moreover, from the front surface 53 as the surface of the phosphor layer 40A, the fluorescence F radiated from the phosphor excited by the laser beams $L_1$ and $L_2$ is radiated.

The metal substrate 35 is a metal plate on which the laser beam L and the fluorescence F are reflected. As the metal substrate 35, for example, an aluminum substrate is used. The laser beam $L_1$ is reflected on the metal substrate 35 and becomes the laser beam $L_2$. Both of the laser beams $L_1$ and $L_2$ pass through the phosphor layer 40A, excite the phosphor, and cause the phosphor to radiate the fluorescence F.

The phosphor layer 40A includes a phosphor and an inorganic adhesive that adheres the phosphor to the metal substrate 35. The phosphor that constitutes the phosphor layer 40A is the same as the phosphor that constitutes the phosphor layer 40 of the first wavelength converter 50, and accordingly, a description thereof will be omitted. Note that, since the metal substrate 35 does not include the phosphor, the phosphor layer 40A includes a plurality of types of the phosphors.

In the phosphor layer 40A, the phosphor is adhered by an inorganic adhesive. As the inorganic adhesive, a translucent inorganic adhesive is used. As the translucent inorganic adhesive, for example, polymethylsilsesquioxane (PMSQ), alumina, silica or the like is used. Moreover, PMSQ gel is preferable in the PMSQ. The PMSQ gel is excellent in transparency, and accordingly, the phosphor layer 40A has translucency. Note that the PMSQ gel is a resultant of curing of PMSQ sol having fluidity.

A description will be given of functions of the first modified example in the first embodiment. The functions of the first modified example in the first embodiment is the same as the functions of the light-emitting device 1 except that a direction where the fluorescence F is radiated from the wavelength converter 50A is different from a direction where the fluorescence F is radiated from the wavelength converter 50 of the light-emitting device 1. Therefore, the description of the function will be partially omitted.

As illustrated in FIG. 4, the laser beam L that has passed through the lens 20 in FIG. 1 enters as the laser beam $L_1$ from the front surface 53 as the surface of the phosphor layer 40A in the wavelength converter 50A. The laser beam $L_1$ is reflected on an interface between the phosphor layer 40A and the metal substrate 35 and becomes the laser beam $L_2$. In the phosphor layer 40A, the fluorescence F is radiated from the phosphor excited by the laser beams $L_1$ and $L_2$ which have transmitted therethrough, and the fluorescence F is radiated from the front surface 53.

A correlated color temperature and average color rendering index Ra of output light of the first modified example in the first embodiment are the same as those in the light-emitting device 1 according to the first embodiment, and accordingly, a description thereof will be omitted.

Next, a description will be given of a method for manufacturing the wavelength converter 50A. First, the metal substrate 35 is prepared, and the phosphor coating liquid to be coated on the surface of the metal substrate 35 is prepared. For example, the phosphor coating liquid includes a solvent, an inorganic adhesive, and the phosphor. As the solvent, for example, there is used alcohol such as ethanol or a mixed solvent of the alcohol and water. As the alcohol, one with a relatively low boiling point, such as methanol, ethanol and isopropyl alcohol (IPA) is preferable since it is easy to dry the same. As the inorganic adhesive, for example, polymethylsilsesquioxane (PMSQ) sol (PMSQ sol) is used. The PMSQ sol may be prepared by appropriately dispersing PMSQ into a solvent. The preparation of the phosphor coating liquid is performed, for example, by adding the phosphor to the inorganic adhesive having fluidity, for example, in the state of sol, stirring an obtained mixture, and adding the solvent thereto.

Figure 5:
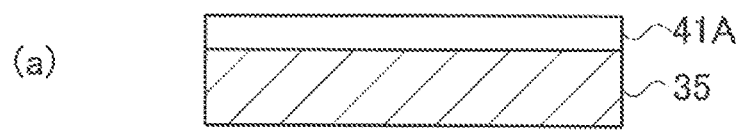
FIG. 5 is diagrams explaining a manufacturing process of the first modified example of the wavelength converter.
Figure 5:
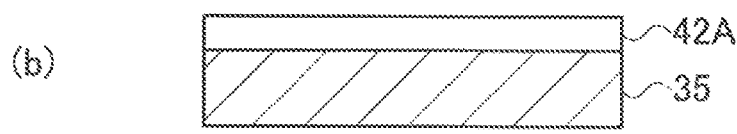
Figure 5:
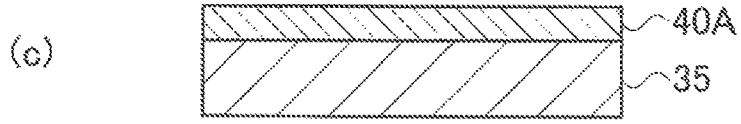

Next, as illustrated in FIG. 5(a), the phosphor coating liquid is dropped onto the surface of the metal substrate 35, and is left, whereby a phosphor coating liquid layer 41A is formed on the surface of the metal substrate 35. Moreover, as illustrated in FIG. 5(b), the phosphor coating liquid layer 41A is left, for example, at room for 1 to 5 hours to dry the phosphor coating liquid layer 41A and remove a part of the solvent, whereby a phosphor coating liquid dried body layer 42A is formed. Next, the metal substrate 35 on the surface of which the phosphor coating liquid dried body layer 42A is formed is heated, for example, at 150 to 250° C. for 0.5 to 2 hours in the atmosphere. In this way, a residue of the solvent is removed, and as illustrated in FIG. 5(c), the phosphor layer 40A having translucency is formed on the surface of the metal substrate 35, and the wavelength converter 50A is obtained.

Second Modified Example in First Embodiment

Figure 6:
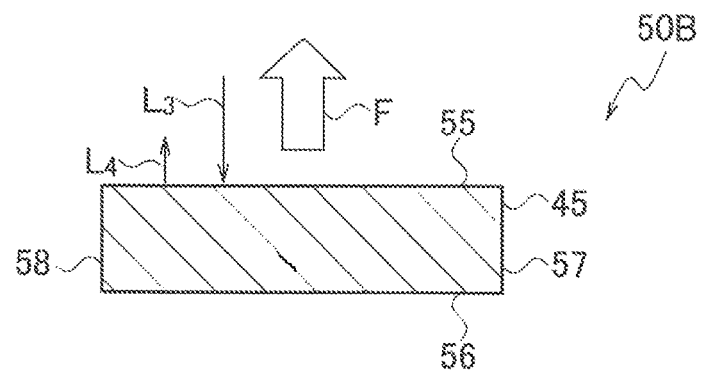
FIG. 6 is a cross-sectional view illustrating a second modified example of the wavelength converter.

A description will be given of a second modified example in the first embodiment. In the second modified example, a wavelength converter 50B as a third wavelength converter is substituted for the wavelength converter 50 of the light-emitting device 1 according to the first embodiment. FIG. 6 is a cross-sectional view illustrating an example of the third wavelength converter 50B. The third wavelength converter 50B is made of phosphor ceramics formed by sintering a phosphor.

As illustrated in FIG. 6, the wavelength converter 50B is made of translucent phosphor ceramics 45 fabricated by sintering the phosphor. The phosphor that constitutes the translucent phosphor ceramics 45 is the same as the phosphors for use in the first wavelength converter 50 and the second wavelength converter 50A except that this phosphor does not have a powder shape, and accordingly, a description thereof will be omitted. Note that the translucent phosphor ceramics 45 may include all of the plurality of types of phosphors, or may include one or more types among the plurality of types of phosphors. Moreover, when the translucent phosphor ceramics 45 include only one type of the phosphors, other phosphors may take a form other than that of the translucent phosphor ceramics 45, and for example, may be the wavelength converter 50 or the wavelength converter 50A.

The translucent phosphor ceramics is composed of only an inorganic material excellent in thermal conductivity, and accordingly, has high heat dissipation. Therefore, even if the phosphor in the translucent phosphor ceramics 45 is subjected to high-density photoexcitation by the laser beam radiated from the solid-state light-emitting element 10, a temperature rise of the wavelength converter 50B can be suppressed effectively. As a result, temperature quenching of the phosphor in the wavelength converter 50B is suppressed, and it becomes possible to increase the output of the light emission.

A description will be given of functions of the second modified example in the first embodiment. The functions of the second modified example are the same as the functions of the wavelength converter 50A of the first modified example except that a portion where the fluorescence F is radiated from the wavelength converter 50B is different from that in the wavelength converter 50A of the first modified example. Therefore, the description of the functions will be partially omitted.

As illustrated in FIG. 6, the laser beam L that has passed through the lens 20 in FIG. 1 enters as a laser beam $L_3$ from the front surface 55 as the surface of the wavelength converter 50B to the translucent phosphor ceramics 45. Much of the laser beam $L_3$ enters the translucent phosphor ceramics 45 from the front surface 55 of the translucent phosphor ceramics 45, and a residue thereof is reflected on the front surface 55 and becomes a laser beam $L_4$. In the translucent phosphor ceramics 45, the fluorescence F is radiated from the phosphor excited by the laser beam $L_3$, and the fluorescence F is radiated from the front surface 55.

Note that, in the wavelength converter 50B, compositions of the front surface 55, a back surface 56, a side surface 57 and a side surface 58 are the same, and accordingly, the laser beam L is radiated to the back surface 56, the side surface 57 and the side surface 58, whereby the fluorescence F can be radiated from the individual surfaces.

A correlated color temperature and average color rendering index Ra of output light of the second modified example in the first embodiment are the same as those in the light-emitting device 1 according to the first embodiment, and accordingly, a description thereof will be omitted. Note that the wavelength converter 50B can be produced by a well-known method for fabricating phosphor ceramics.

Second Embodiment

A light-emitting device 1A according to a second embodiment will be described. The light-emitting device 1A according to the second embodiment is different from the light-emitting device 1 according to the first embodiment in that a plurality of the solid-state light-emitting elements 10 are present. Moreover, in the light-emitting device 1A, laser beams L radiated from the plurality of solid-state light-emitting elements 10 are condensed to the wavelength converter 50 via optical transmission lines 23 such as optical fibers. The light-emitting device 1A is the same as the light-emitting device 1 according to the first embodiment, and accordingly, a description thereof will be omitted.

Figure 7:
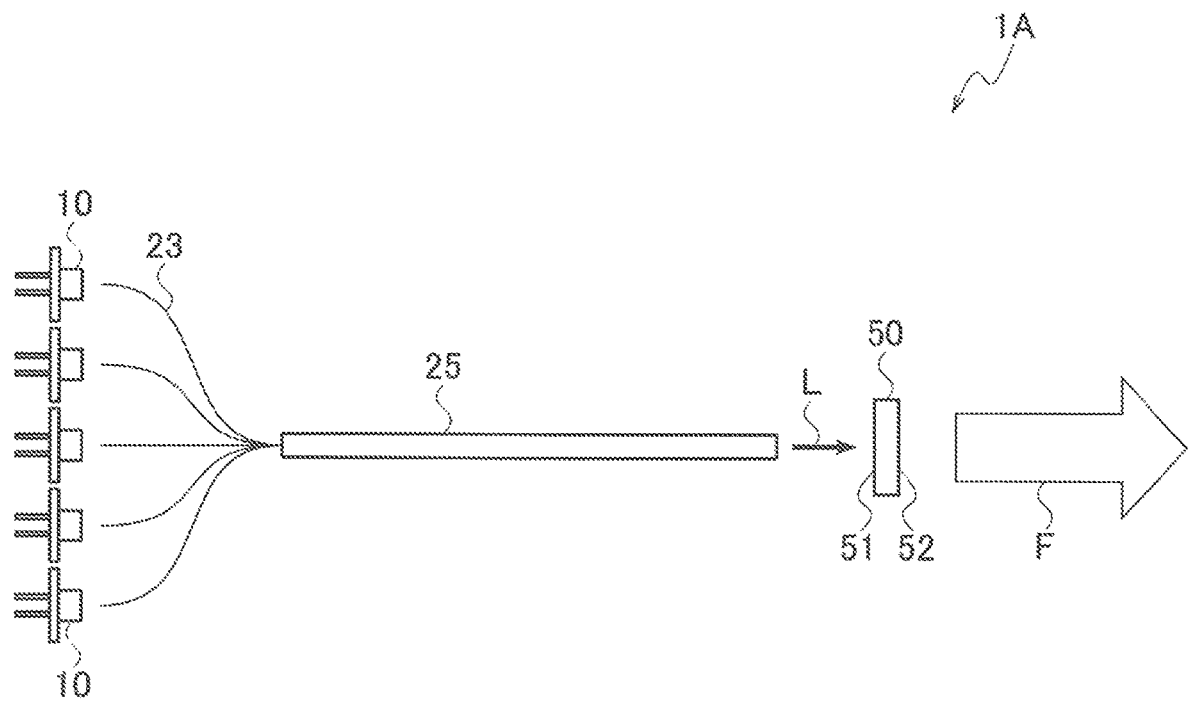
FIG. 7 is a schematic diagram illustrating a light-emitting device according to a second embodiment of the present invention.

As illustrated in FIG. 7, well-known optical fibers are used as the optical transmission lines 23 for use in the light-emitting device 1A. The plurality of optical transmission lines 23 provided to correspond to the plurality of solid-state light-emitting elements 10 are bundled to form an optical transmission line aggregate 25 such as an optical fiber aggregate.

Functions of the light-emitting device 1A are the same as the functions of the light-emitting device 1 except that the plurality of solid-state light-emitting elements 10 are present, and that the laser beams L radiated from the plurality of solid-state light-emitting elements 10 are condensed to the wavelength converter 50 via the optical transmission lines 23 and the optical transmission line aggregate 25. Therefore, a description of the functions will be omitted. Moreover, as in the light-emitting device 1, in the light-emitting device 1A, the wavelength converter 50A or the wavelength converter 50B may be used in place of the wavelength converter 50.

The light-emitting device of this embodiment uses only the $Ce^{3+}$-activated phosphors, which exhibit ultrashort afterglow and are stable even in the atmosphere, as the phosphor for use in the wavelength converter. Accordingly, light emission of the light-emitting device of this embodiment is hard to be saturated even under high-density photoexcitation by the laser beam irradiation, and the light-emitting device has high output and high long-term reliability. Then, such output light has a light component across the wavelength range of at least 420 nm or more and less than 700 nm. Therefore, the light-emitting device of this embodiment is suitable as a laser lighting device.

EXAMPLES

Hereinafter, this embodiment will be described more in detail by examples; however, this embodiment is not limited to these examples.

In this example, a powder compact of mixed phosphor powder was used as a wavelength converter for the purpose of obtaining the functions and effects of this embodiment safely and easily. Moreover, a monochrome beam with a peak wavelength of 405 nm (purple) was used as a pseudo laser beam. That is, prepared was an example of a light-emitting device in which the powder compact of the mixed phosphor powder was used as the wavelength converter and the monochrome beam was used as the pseudo laser beam.

Specifically, the monochrome beam was used as excitation light, and was applied to the powder compact of the mixed phosphor powder. Then, mixed light was obtained, in which a reflected light component of the excitation light, which was reflected by the powder compact, and a fluorescent component emitted from the wavelength converter by application of the excitation light were mixed with each other. Moreover, a spectral distribution of the mixed light was investigated by an instant multi-photometry system (MCPD-9800, made by Otsuka Electronics Co., Ltd.). Thereafter, a color tone of the mixed light was controlled by varying a reflected light component intensity, and simple evaluation was performed for the functions and effects of this embodiment.

Note that the matter that the functions and effects of the light-emitting device of this embodiment can be evaluated by such a simple method is obvious to those skilled in the art.

In this example, as the first phosphor, the $(Sr_{0.7}Ca_{0.3})Lu_2O_4:Ce^{3+}$ phosphor emitting blue-green fluorescence was used. Moreover, as the second phosphor, the $Lu_2CaMg_2(SiO_4)_3:Ce^{3+}$ phosphor emitting orange fluorescence was used.

Note that the above-described $(Sr_{0.7}Ca_{0.3})Lu_2O_4:Ce^{3+}$ phosphor is a compound having a calcium ferrite-type crystal structure represented by a general formula $(Sr_{0.7}Ca_{0.3})(Lu_{0.9995}Ce_{0.0005})_2O_4$. Then, in the $(Sr_{0.7}Ca_{0.3})Lu_2O_4:Ce^{3+}$ phosphor, an excitation peak wavelength thereof was present in the vicinity of 410 nm, and a fluorescence peak wavelength thereof was present in the vicinity of 472 nm.

Meanwhile, the above-described $Lu_2CaMg_2(SiO_4)_3:Ce^{3+}$ phosphor is a compound having a garnet-type crystal structure represented by a general formula $(Lu_{0.97}Ce_{0.03})_2CaMg_2(SiO_4)_3$. Then, in the $Lu_2CaMg_2(SiO_4)_3:Ce^{3+}$ phosphor, an excitation peak wavelength thereof was present in the vicinity of 470 nm, and a fluorescence peak wavelength thereof was present in the vicinity of 600 nm. Note that an excitation intensity of the above-described $Lu_2CaMg_2(SiO_4)_3:Ce^3$ phosphor in the vicinity of 405 nm is as small as approximately 20% of an intensity thereof at the excitation peak wavelength. This means that the $Lu_2CaMg_2(SiO_4)_3:Ce^{3+}$ phosphor is a phosphor that is hardly excited by the violet monochrome beam with a wavelength of 405 nm and does not emit fluorescence substantially.

The $(Sr_{0.7}Ca_{0.3})Lu_2O_4:Ce^{3+}$ phosphor and the $Lu_2CaMg_2(SiO_4)_3:Ce^{3+}$ were blended with each other in a mass ratio of roughly 5:4 (0.69 g:0.55 g), and were manually mixed with each other for five minutes by using an alumina mortar and an alumina pestle. A slightly larger amount of the mixed phosphor powder was poured into a sample holder with a diameter of 12 cm and a depth of 2 mm, and thereafter, by using a glass slide, the mixed phosphor powder was slightly pressed by hand so that a surface thereof became flat, whereby a powder compact to be used as a wavelength converter was formed.

Thereafter, a monochrome beam with a wavelength of 405 nm was applied to the powder compact, and mixed light of a reflected light component of the monochrome beam by the powder compact and a fluorescent component emitted from the powder compact was subjected to spectral measurement. Moreover, an intensity of the reflected light component in such a spectral distribution was reduced, and was adjusted so that white light with a correlated color temperature of 6500 K was obtained.

Figure 8:
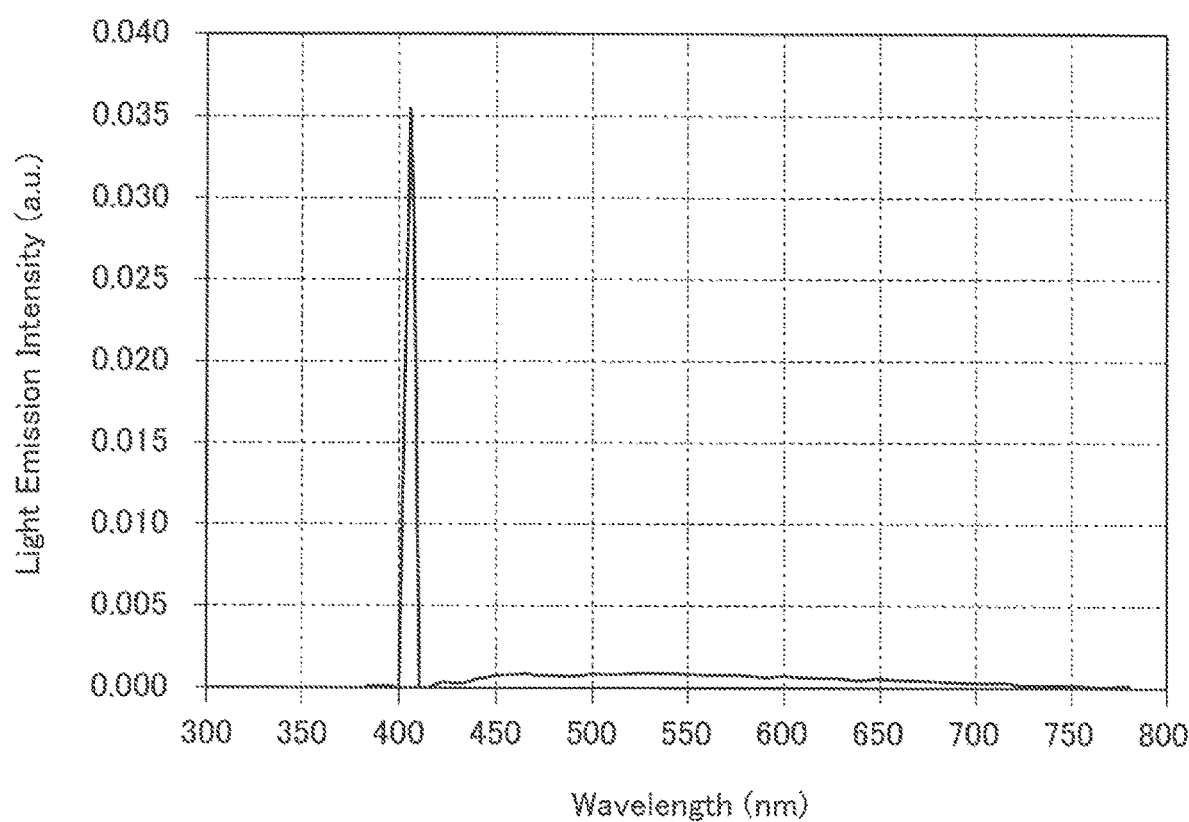
FIG. 8 is a graph illustrating an example of a spectral distribution of output light radiated from a light-emitting device of an example.

Note that, in an actual light-emitting device that uses the laser beam and the phosphor layer, an optical filter (high-pass filter/low-cut filter) that absorbs light with a wavelength of less than 410 nm is provided, whereby a light-emitting device in which the intensity of the reflected light component is reduced can be formed. Moreover, a wavelength converter in which a thickness and the like are adjusted so that a light absorption rate of the excitation light is increased is used, whereby the light-emitting device in which the intensity of the reflected light component is reduced can also be formed FIG. 8 illustrates a spectral distribution of the white light thus obtained. As illustrated in FIG. 8, though the $Lu_2CaMg_2(SiO_4)_3:Ce^{3+}$ phosphor that does not substantially emit fluorescence by the monochrome beam with a wavelength of 405 nm is used, a fluorescent component was observed in a wavelength range of 600 nm or more and 780 nm or less. That is, though the $Lu_2CaMg_2(SiO_4)_3:Ce^{3+}$ phosphor was used, a fluorescent component was observed in a wavelength range from orange through red to deep red by the excitation of the monochrome beam.

A reason why this fluorescent component was observed is guessed as follows. A difference between the peak wavelength (in the vicinity of 472 nm) of the fluorescence spectrum of the $(Sr_{0.7}Ca_{0.3})Lu_2O_4:Ce^{3+}$ phosphor and the peak wavelength (in the vicinity of 470 nm) of the excitation spectrum of the $Lu_2CaMg_2(SiO_4)_3:Ce^{3+}$ phosphor is as small as several nanometers (nm). Therefore, it is considered that the $Lu_2CaMg_2(SiO_4)_3:Ce^{3+}$ phosphor was excited by the fluorescence of the $(Sr_{0.7}Ca_{0.3})Lu_2O_4:Ce^{3+}$ phosphor, resulting in that the $Lu_2CaMg_2(SiO_4)_3:Ce^{3+}$ phosphor came to emit fluorescence. That is, it is indicated that a part of the violet monochrome beam was subjected to wavelength conversion to orange fluorescence by transfer of energy from the $(Sr_{0.7}Ca_{0.3})Lu_2O_4:Ce^{3+}$ phosphor to the $Lu_2CaMg_2(SiO_4)_3:Ce^{3+}$ phosphor.

Note that a variety of indices of the illumination light emitted from the light-emitting device of the example are as shown in Table 1, and it is seen that, in accordance with this embodiment, white light with an average color rendering index (Ra) of 90 or more is achieved. Note that Table 2 shows indices R1 to R8 as results of calculating the average color rendering index (Ra) and indices R9 to R15 as results of calculating special color rendering index.

TABLE 1

| | |
|---|---|
| Tc (correlated color temperature) | 6500 |
| duv (deviation) | 9.49 |
| x (chromaticity coordinate) | 0.3113 |
| y (chromaticity coordinate) | 0.3402 |
| u (chromaticity coordinate) | 0.1928 |
| v (chromaticity coordinate) | 0.316 |
| Ra (average color rendering index) | 90 |

TABLE 2

| | |
|---|---|
| R1 | 86 |
| R2 | 90 |
| R3 | 95 |
| R4 | 90 |
| R5 | 88 |
| R6 | 89 |
| R7 | 94 |
| R8 | 85 |
| R9 | 49 |
| R10 | 78 |
| R11 | 88 |
| R12 | 84 |
| R13 | 85 |
| R14 | 96 |
| R15 | 82 |

Although the content of this embodiment has been described above in accordance with the examples, it is obvious to those skilled in the art that this embodiment is not limited to the description of these and that various modifications and improvements and characteristic adjustments by these are possible.

The entire contents of Japanese Patent Application No. 2017-029194 (filed on: Feb. 20, 2017) are incorporated herein by reference.

INDUSTRIAL APPLICABILITY

In accordance with the present invention, there can be obtained a light-emitting device capable of radiating light with high color rendering properties over a wide wavelength range.

REFERENCE SIGNS LIST 1, 1A Light-emitting device
10 Solid-state light-emitting element
30 Transparent substrate
35 Metal substrate
40, 40A Phosphor layer
50, 50A, 50B Wavelength converter
F Fluorescence
L, L1, L2, L3, L4 Laser beam

The invention claimed is:

1. A light-emitting device comprising:
a solid-state light-emitting element that radiates a laser beam having a maximum intensity value within a wavelength range of 380 nm or more and less than 420 nm; and
a wavelength converter that includes a plurality of types of phosphors which receive the laser beam and radiate light,
wherein the phosphors included in the wavelength converter are substantially composed of a $Ce^{3+}$-activated phosphor,
wherein the plurality of types of phosphors include: a first phosphor that emits first fluorescence having a maximum intensity value within a wavelength range of 435 nm or more and less than 500 nm; and a second phosphor that emits second fluorescence having a maximum intensity value within a wavelength range of 580 nm or more and less than 630 nm,
wherein the first phosphor is excited by the laser beam, and the second phosphor is excited by at least fluorescence emitted by the first phosphor, and
wherein output light has a light component across a wavelength range of at least 420 nm or more and less than 700 nm.

2. The light-emitting device according to claim 1, wherein the plurality of types of phosphors further include a third phosphor that emits third fluorescence having a maximum intensity value within a wavelength range of 500 nm or more and less than 580 nm.

3. The light-emitting device according to claim 1, wherein, with regard to an excitation spectrum of the second phosphor, an intensity thereof at a wavelength of 420 nm is larger than an intensity thereof at a wavelength where the laser beam reaching a maximum intensity.

4. The light-emitting device according to claim 1, wherein the first phosphor is a $Ce^{3+}$-activated phosphor composed based on a compound (a) containing, as a main component, at least one selected from the group consisting of alkaline earth metal oxide, alkaline earth metal halo-aluminate, rare earth aluminate, rare earth oxynitride alumino-silicate, and rare earth aluminonitride silicate, each of which has a calcium ferrite-type structure.

5. The light-emitting device according to claim 1, wherein the first phosphor is a $Ce^{3+}$-activated phosphor composed based on a compound (b) containing, as a main component, at least one selected from the group consisting of $MRE_2O_4$, $M_3AlO_4F$, $M_2REX_2(AlO_4)_3$, $REAl(Si_{6-z}Al_z)(N_{10-z}O_z)$, and $RE_3Si_3N_5$, or based on a solid solution containing the compound (b) as an end member, and the M is alkaline earth metal, the RE is a rare earth element, the X is at least either one of Zr and Hf, and the z is a numerical value that satisfies 0≤z<1.

6. The light-emitting device according to claim 1, wherein the second phosphor is a $Ce^{3+}$-activated phosphor composed based on a compound (c) containing, as a main component, at least one selected from the group consisting of rare earth silicate, rare earth aluminate, rare earth alumino-silicate, alkaline earth metal aluminonitride silicate, and rare earth nitride silicate.

7. The light-emitting device according to claim 1, wherein the second phosphor is a $Ce^{3+}$-activated phosphor composed based on a compound (d) containing, as a main component, at least one selected from the group consisting of $RE_2MMg(SiO_4)_3$, $RE_3Al_2(AlO_4)_3$, $RE_3Mg_2(SiO_4)_2(AlO_4)$, $MAlSiN_3$, and $RE_3Si_6N_{11}$, or based on a solid solution containing the compound (d) as an end member, and the M is alkaline earth metal, and the RE is a rare earth element.

8. The light-emitting device according to claim 1, wherein the second phosphor has a maximum intensity value of an excitation spectrum within a wavelength range of 435 nm or more and less than 500 nm.

9. The light-emitting device according to claim 1, wherein, when a peak wavelength of the fluorescence spectrum of the first phosphor is $\lambda_{em}$, and a peak wavelength of the excitation spectrum of the second phosphor is $\lambda_{ex}$, a difference between $\lambda_{em}$ and $\lambda_{ex}$ is 20 nm or less.

10. The light-emitting device according to claim 1, wherein the wavelength converter is made of an inorganic material.

11. The light-emitting device according to claim 10, wherein the wavelength converter includes: a transparent substrate through which the laser beam transmits; and a phosphor layer that is formed on a surface of the transparent substrate and includes the phosphors, and wherein the phosphor layer includes the phosphors and an inorganic adhesive that adheres the phosphors to the transparent substrate.

12. The light-emitting device according to claim 10, wherein the wavelength converter includes: a metal substrate on which the laser beam is reflected; and a phosphor layer that is formed on a surface of the metal substrate and includes the phosphors, and wherein the phosphor layer includes the phosphors and an inorganic adhesive that adheres the phosphors to the metal substrate.

13. The light-emitting device according to claim 10, wherein the wavelength converter is made of phosphor ceramics formed by sintering the phosphors.

14. The light-emitting device according to claim 1, wherein all of $Ce^{3+}$-activated phosphors included in the wavelength converter are oxide-based phosphors.

15. The light-emitting device according to claim 1, wherein all of $Ce^{3+}$-activated phosphors included in the wavelength converter are nitride-based phosphors.

16. The light-emitting device according to claim 1, wherein all of $Ce^{3+}$-activated phosphors included in the wavelength converter contain phosphors each having a garnet structure.

17. The light-emitting device according to claim 1, wherein an average particle size of the phosphors is 3 μm to 100 μm.

18. The light-emitting device according to claim 1, wherein the light-emitting device radiates the output light with a correlated color temperature of 2500 K or more and less than 7000 K.

19. The light-emitting device according to claim 1, wherein the light-emitting device radiates the output light in which an average color rendering index Ra is 80 or more and less than 98.

20. The light-emitting device according to claim 1, wherein the light-emitting device is a laser illuminator.

* * * * *